United States Patent [19]
Oku et al.

[11] Patent Number: 6,051,847
[45] Date of Patent: Apr. 18, 2000

[54] GALLIUM NITRIDE COMPOUND-BASED SEMICONDUCTOR LIGHT EMITTING DEVICE AND PROCESS FOR PRODUCING GALLIUM NITRIDE COMPOUND-BASED SEMICONDUCTOR THIN FILM

[75] Inventors: Yasunari Oku; Hidemi Takeishi; Hidenori Kamei, all of Fukuoka; Shuuichi Shinagawa, Kasuga, all of Japan

[73] Assignee: Matsushita Electric Industrial Co., Ltd., Osaka, Japan

[21] Appl. No.: 09/069,849

[22] Filed: Apr. 30, 1998

[30] Foreign Application Priority Data

| | | | |
|---|---|---|---|
| May 21, 1997 | [JP] | Japan | 9-130765 |
| Aug. 4, 1997 | [JP] | Japan | 9-208828 |
| Sep. 29, 1997 | [JP] | Japan | 9-263109 |

[51] Int. Cl.$^7$ .................................................. H01L 33/00
[52] U.S. Cl. ............................................. 257/94; 372/45
[58] Field of Search ................................. 257/94; 372/45

[56] References Cited

U.S. PATENT DOCUMENTS

| | | | |
|---|---|---|---|
| 5,689,123 | 11/1997 | Major et al. | 257/190 |
| 5,729,029 | 3/1998 | Rudaz | 257/13 |
| 5,786,603 | 7/1998 | Rennie et al. | 257/13 |
| 5,838,706 | 11/1998 | Edmond et al. | 372/45 |

*Primary Examiner*—Olik Chaudhuri
*Assistant Examiner*—Douglas A. Wille
*Attorney, Agent, or Firm*—Stevens, Davis, Miller & Mosher, L.L.P.

[57] ABSTRACT

In the present invention, by organometallic vapor deposition, a buffer layer containing indium is grown on a substrate and an n-type gallium nitride compound-based semiconductor thin film containing indium is grown on the buffer layer. Thus, the occurrence of distortion and crystal defects in the vicinity of the boundary surface between the buffer layer and the n-type gallium nitride compound-based semiconductor thin film is reduced, so that the gallium nitride compound-based semiconductor thin film having an excellent crystallinity can be obtained.

As a gallium nitride compound-based semiconductor light emitting device using gallium nitride compound-based semiconductor thin films which has excellent light-emitting properties, there can be obtained a gallium nitride compound-based semiconductor light emitting device comprising a substrate, a buffer layer of $Al_{1-x}In_xN$ ($0<x<1$) formed on the substrate, an n-type gallium nitride compound-based semiconductor thin film formed on the buffer layer, and a p-type gallium nitride compound-based semiconductor thin film formed on the n-type gallium nitride compound-based semiconductor thin film, wherein the buffer layer and the gallium nitride compound-based semiconductor thin films have an improved flatness.

7 Claims, 3 Drawing Sheets

GALLIUM NITRIDE COMPOUND-BASED SEMICONDUCTOR LIGHT EMITTING DEVICE AND PROCESS FOR PRODUCING GALLIUM NITRIDE COMPOUND-BASED SEMICONDUCTOR THIN FILM

BACKGROUND OF THE INVENTION

The present invention relates to a gallium nitride compound-based semiconductor light emitting device and a process for producing a gallium nitride compound-based semiconductor thin film.

Gallium nitride compound-based semiconductors have been noted as semiconductor materials for visible-light emitting devices and high-temperature working electron devices. In these devices, structures formed by laminating semiconductor thin films are generally employed.

As a method for growing a gallium nitride compound-based semiconductor thin film, organometallic chemical vapor deposition is well known. This method comprises feeding organometallic compound gases, e.g. trimethylgallium (hereinafter referred to as TMG), trimethylaluminum (hereinafter referred to as TMA) and trimethylindium (hereinafter referred to as TMI), as starting gases of Group III elements, and ammonia, hydrazine or the like as a starting gas of a Group V element into a reaction tube having a substrate set therein, and maintaining the substrate temperature at a high temperature of approximately 900° C. to 1,100° C. to grow a gallium nitride compound-based semiconductor thin film on the substrate. When a gallium nitride compound-based semiconductor is grown by this method, a material different therefrom but relatively similar thereto in lattice constant, such as sapphire or silicon carbide (SiC) is used as the substrate because there is no substrate made of a gallium nitride compound-based semiconductor.

However, there is a large lattice mismatch between a gallium nitride compound-based semiconductor and a sapphire or SiC substrate, so that when the gallium nitride compound-based semiconductor is grown directly on the substrate at a high temperature, it grows into an island structure. Therefore, no flat surface can be obtained.

As a means for solving this problem, there is a method of, as disclosed in JP-A-2-229476 and JP-A-6-151962, growing a buffer layer of amorphous aluminum nitride (AlN) or gallium aluminum nitride (AlGaN) on a substrate at a low temperature before growing a gallium nitride compound-based semiconductor, and growing the gallium nitride compound-based semiconductor on the buffer layer at a high temperature. By this method, there have been produced light emitting devices having a structure formed by laminating gallium nitride compound-based semiconductor thin films.

However, even if the conventional method using the buffer layer grown at a low temperature is employed, the gallium nitride compound-based semiconductor thin film grown on the buffer layer has many defects. Therefore, the light emitting devices produced by using such thin films have no satisfactory characteristics. For realizing the production of a highly efficient light emitting device, there is desired further improvement in the crystallinity of gallium nitride compound-based semiconductor thin films.

The above-mentioned conventional technique uses the buffer layer grown at a low temperature before growing a gallium nitride compound-based semiconductor thin film at a high temperature. In such a method, in general, the quality of the gallium nitride compound-based semiconductor thin film to be grown on the buffer layer is improved only by optimizing, for example, a material and growth conditions for the buffer layer to be grown at a low temperature or growth conditions for the gallium nitride compound-based semiconductor to be grown at a high temperature, and no particular attention is paid to improvement of the quality of the gallium nitride compound-based semiconductor thin film which is carried out by noting the structure of the thin film itself in the vicinity of the boundary surface between the thin film and the buffer layer.

Therefore, the present invention is intended to provide a gallium nitride compound-based semiconductor light emitting device having excellent light-emitting properties.

The present invention is also intended to provide a gallium nitride compound-based semiconductor thin film excellent in crystallinity.

When AlN is used as the buffer layer, the growth of a two-dimensional and flat gallium nitride compound-based semiconductor thin film is macroscopically possible, but microscopically, the unevenness of the surface of the thin film remains and the crystallinity is not sufficient. Therefore, the thin film is desired to be improved. Particularly in a quantum well structure device comprising gallium nitride compound-based semiconductor thin films, the heterojunction boundary surface is required to have flatness at the atomic level. Conventional methods are disadvantageous in that no satisfactory light-emitting properties can be attained because the structure of a light-emitting layer located at the heterojunction boundary surface becomes nonuniform due to the unevenness of the surface of the thin film.

Accordingly, the present invention is intended to provide a gallium nitride compound-based semiconductor light emitting device having excellent light-emitting properties.

The present invention is also intended to provide a process for producing a gallium nitride compound-based semiconductor thin film excellent in surface flatness and crystallinity.

SUMMARY OF THE INVENTION

The present invention solves the above-mentioned problems associated with the prior art. For this purpose, the gallium nitride compound-based semiconductor light emitting device according to the present invention comprises a substrate, an indium-containing buffering layer on the substrate, and a film of gallium nitride compound-based semiconductor on the buffering layer, the film of gallium nitride compound-based semiconductor containing indium at a surface on which the film is in contact with the buffering layer.

Thus, it becomes possible to obtain a light emitting device having excellent light-emitting properties.

The process for producing a gallium nitride compound-based semiconductor thin film according to the present invention comprises preparing a substrate, depositing an indium-containing buffering layer on the substrate, and depositing an indium-containing gallium nitride compound-based semiconductor film on the buffering layer.

Thus, it becomes possible to obtain a gallium nitride compound-based semiconductor thin film superior in crystallinity to that obtained by using a buffering layer containing no indium.

In addition, for solving the above-mentioned problems in prior art, the gallium nitride compound-based semiconductor light emitting device according to the present invention comprises a substrate, a buffering layer comprising $Al_{1-x}In_xN$ wherein $0<x<1$, on the substrate, and a film of gallium nitride compound-based semiconductor on the buffering layer, the $Al_{1-x}In_xN$ being mixed crystals of AlN and InN (indium nitride).

Thus, the surface flatness and the crystallinity are markedly improved, so that there can be obtained a light emitting device comprising gallium nitride compound-based semiconductor thin films which has excellent light-emitting properties.

In addition, the process for producing a gallium nitride compound-based semiconductor thin film according to the present invention employs organometallic chemical vapor deposition and comprises depositing a buffering layer of $Al_{1-x}In_xN$, wherein $0<x<1$, on a substrate, and depositing a gallium nitride compound-based semiconductor film on the buffering layer.

Thus, distortion due to the difference in lattice constant between the buffering layer and the gallium nitride compound-based semiconductor thin film on the buffer layer becomes easily absorbable, so that the occurrence of crystal defects is reduced. Therefore, there can be produced a gallium nitride compound-based semiconductor thin film excellent in surface flatness and crystallinity.

DETAILED DESCRIPTION OF THE INVENTION

Figure 1:
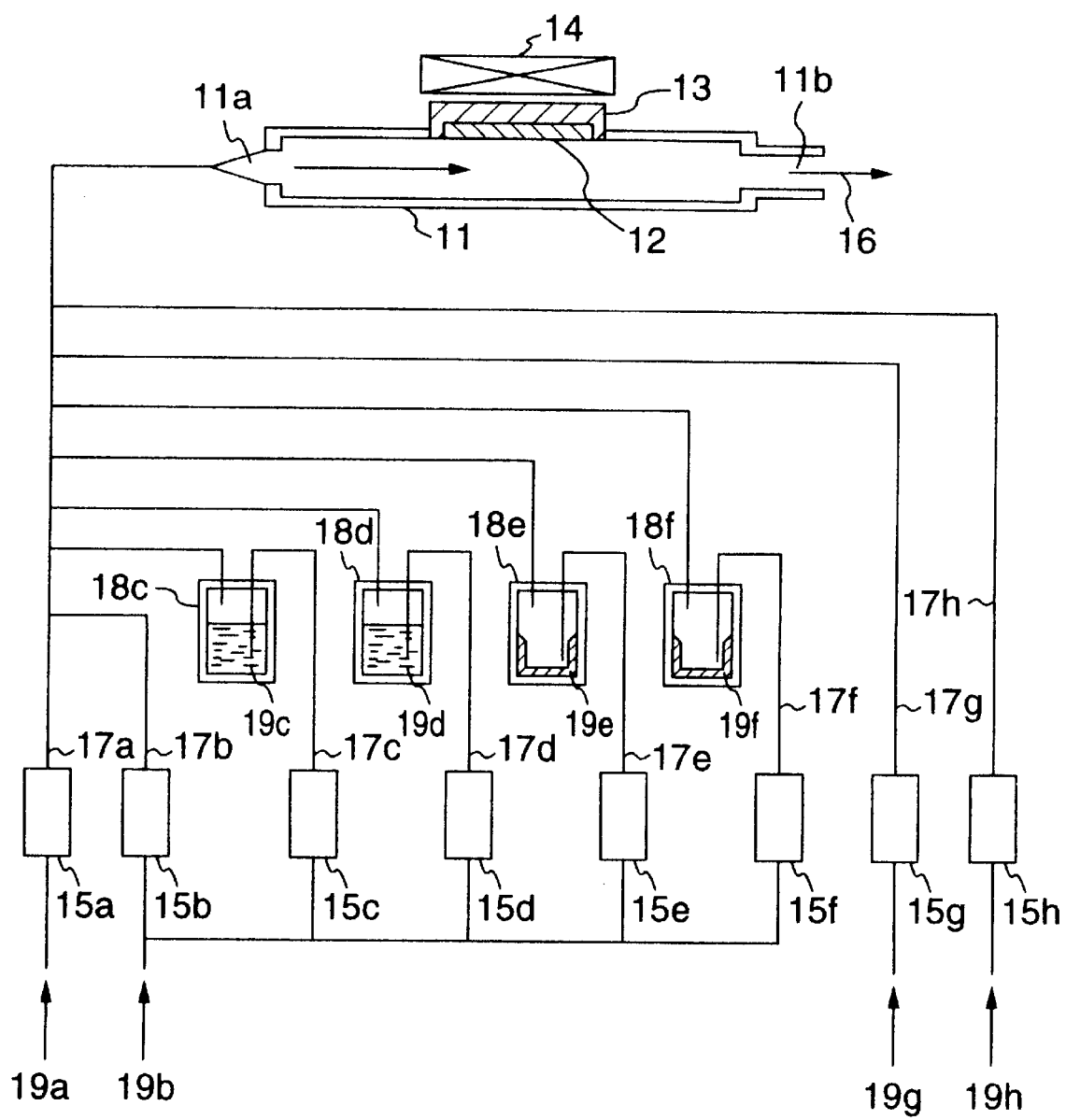
FIG. 1 is a cross-sectional view of the principal part of an organometallic chemical vapor deposition apparatus used in embodiments of the present invention.

The 1st aspect of the present invention is directed to a gallium nitride compound-based semiconductor light emitting device comprising a substrate, a buffering layer containing indium on the substrate, and a film of gallium nitride compound-based semiconductor on the buffering layer, the film containing indium at a surface on which the film is in contact with the buffering layer. This light emitting device can have excellent light-emitting properties because of the improved crystallinity of the gallium nitride compound-based semiconductor thin films.

The 2nd aspect of the present invention is directed to a gallium nitride compound-based semiconductor light emitting device according to the 1st aspect, which is characterized in that the concentration of indium contained in said gallium nitride compound-based semiconductor thin film has a tendency of decreasing from the side on which the thin film is in contact with said buffering layer. In particular, the gallium nitride compound-based semiconductor thin film has an improved crystallinity.

The 3rd aspect of the present invention is directed to a gallium nitride compound-based semiconductor light emitting device comprising a substrate, a buffering layer comprising $Al_{1-x}In_xN$, wherein $0<x<1$, on the substrate, and a gallium nitride compound-based semiconductor film on the buffering layer. In this light emitting device, distortion due to the difference in lattice constant between the buffering layer and the gallium nitride compound-based semiconductor thin film on the buffering layer is more easily absorbable than on an AlN buffering layer, so that the occurrence of crystal defects is reduced.

The 4th aspect of the present invention is directed to a gallium nitride compound-based semiconductor light emitting device according to the 3rd aspect, which is characterized in that the gallium nitride compound-based semiconductor film contains indium at a surface on which the film is in contact with the buffering layer. This light emitting device can have excellent light-emitting properties because of the improved crystallinity of the gallium nitride compound-based semiconductor thin film.

The 5th aspect of the present invention is directed to a gallium nitride compound-based semiconductor light emitting device according to the 3rd aspect, wherein the solid phase molar ratio value x of InN in $Al_{1-x}In_xN$ of the buffering layer is in the range of $0.2 \leq x \leq 0.8$. In this light emitting device, distortion due to the difference in lattice constant between the buffering layer and the gallium nitride compound-based semiconductor thin film on the buffering layer is more easily absorbable than on an AlN buffering layer, so that the occurrence of crystal defects is reduced.

The 6th aspect of the present invention is directed to a gallium nitride compound-based semiconductor light emitting device according to the 3rd aspect, wherein the solid phase molar ratio value x of InN in $Al_{1-x}In_xN$ of the buffering layer is in the range of $0.6 \leq x \leq 0.8$. In this light emitting device, distortion due to the difference in lattice constant between the gallium nitride compound-based semiconductor film and the buffering layer is easily absorbable, so that the occurrence of crystal defects is reduced.

The 7th aspect of the present invention is directed to a gallium nitride compound-based semiconductor light emitting device according to the 3rd aspect, wherein the solid phase molar ratio value x of InN in $Al_{1-x}In_xN$ of the buffering layer is smaller on the gallium nitride compound-based semiconductor film side than on the substrate side. Thus, the difference in lattice constant between the gallium nitride compound-based semiconductor film and the buffering layer at the boundary surface between them can be reduced.

The 8th aspect of the present invention is directed to a gallium nitride compound-based semiconductor light emitting device according to the 3rd aspect, wherein the thickness of the buffering layer is from 5 nm to 50 nm. In this light emitting device, distortion due to the difference in lattice constant between the buffer layer and the gallium nitride compound-based semiconductor thin film on the buffering layer is easily absorbable, so that the occurrence of crystal defects is reduced.

The 9th aspect of the present invention is directed to a gallium nitride compound-based semiconductor light emitting device according to the 3rd aspect, wherein the film of gallium nitride compound-based semiconductor includes an n-type gallium nitride compound-based semiconductor film and a p-type gallium nitride compound-based semiconductor film. In this light emitting device, the occurrence of crystal defects in the n-type and p-type gallium nitride compound-based semiconductor thin films on the buffering layer is reduced as compared with an AlN buffering layer.

The 10th aspect of the present invention is directed to a process for producing a gallium nitride compound-based semiconductor thin film by organometallic chemical vapor deposition, which comprises preparing a substrate, depositing on the substrate an indium-containing buffering layer, and then depositing on the buffering layer an indium-containing, gallium nitride compound-based semiconductor film. According to this process, the gallium nitride compound-based semiconductor thin film on the buffering layer has an improved crystallinity.

The 11th aspect of the present invention is directed to a process for producing a gallium nitride compound-based semiconductor film according to the 10th aspect, wherein in the formation of the gallium nitride compound-based semiconductor thin film, indium is incorporated into the gallium nitride compound-based semiconductor film at a surface on which the film is in contact with the buffering layer. According to this process, distortion and the like between the buffering layer and the gallium nitride compound-based semiconductor film on the buffering layer is alleviated, resulting in an improved crystallinity.

The 12th aspect of the present invention is directed to a process for producing a gallium nitride compound-based semiconductor thin film according to the 10th aspect, wherein in the formation of the gallium nitride compound-based semiconductor film, indium is incorporated into the gallium nitride compound-based semiconductor film so that the indium concentration may be decreased in the direction of growth of the film from the surface on which the film is in contact with the buffering layer. According to this process, the difference in lattice constant between the buffering layer and the gallium nitride compound-based semiconductor film on the buffering layer is reduced near the boundary surface between them, so that the occurrence of distortion, crystal defects, etc. is reduced, resulting in an improved crystallinity.

The 13th aspect of the present invention is directed to a process for producing a gallium nitride compound-based semiconductor film according to the 10th aspect, wherein the indium in the gallium nitride compound-based semiconductor film is that incorporated thereinto by transferring indium in the buffering layer by diffusion or the like. According to this process, the concentration of indium contained in the gallium nitride compound-based semiconductor thin film is increased near the boundary surface between the film and the buffering layer, so that the difference in lattice constant between the thin film and the buffering layer is further reduced. Therefore, the occurrence of distortion, crystal defects, etc. is further reduced, resulting in a further improved crystallinity.

The 14th aspect of the present invention is directed to a process for producing a gallium nitride compound-based semiconductor thin film according to the 10th aspect, wherein the indium in the gallium nitride compound-based semiconductor film is that incorporated thereinto by controlling the flow rate of a starting gas containing indium, during the growth of the gallium nitride compound-based semiconductor thin film. According to this process, the concentration of indium contained in the gallium nitride compound-based semiconductor film can be increased near the boundary surface between the film and the buffering layer with good controllability, so that the crystallinity can easily be improved.

The 15th aspect of the present invention is directed to a process for producing a gallium nitride compound-based semiconductor film by organometallic chemical vapor deposition, which comprises preparing a substrate, growing a buffering layer of $Al_{1-x}In_xN$, wherein $0<x<1$, on the substrate, and growing a gallium nitride compound-based semiconductor film on the buffering layer. According to this process, distortion due to the difference in lattice constant between the buffering layer and the gallium nitride compound-based semiconductor film on the buffering layer is more easily absorbable than on an AlN buffering layer, so that the occurrence of crystal defects is reduced.

The 16th aspect of the present invention is directed to a process for producing a gallium nitride compound-based semiconductor film according to the 15th aspect, wherein in the formation of the gallium nitride compound-based semiconductor film, indium is incorporated into the gallium nitride compound-based semiconductor film so that the indium concentration may be decreased in the direction of growth of the film from the side on which the thin film is in contact with the buffering layer. According to this process, the difference in lattice constant between the buffering layer and the gallium nitride compound-based semiconductor thin film on the buffering layer is reduced near the boundary surface between them, so that the occurrence of distortion, crystal defects, etc. is reduced, resulting in an improved crystallinity.

The 17th aspect of the present invention is directed to a process for producing a gallium nitride compound-based semiconductor film according to the 15th aspect, wherein the solid phase molar ratio value x of InN in $Al_{1-x}In_xN$ of the buffering layer is in the range of $0.2 \leq x \leq 0.8$. According to this process, distortion due to the difference in lattice constant between the buffering layer and the gallium nitride compound-based semiconductor thin film on the buffering layer is more easily absorbable than on an AlN buffering layer, so that the occurrence of crystal defects is reduced.

The 18th aspect of the present invention is directed to a process for producing a gallium nitride compound-based semiconductor film according to the 15th aspect, wherein the solid phase molar ratio value x of InN in $Al_{1-x}In_xN$ of the buffering layer is in the range of $0.6 \leq x \leq 0.8$. According to this process, distortion due to the difference in lattice constant between the buffering layer and the gallium nitride compound-based semiconductor film formed on the buffering layer is more easily absorbable than on an AlN buffering layer, so that the occurrence of crystal defects is reduced.

The 19th aspect of the present invention is directed to a process for producing a gallium nitride compound-based semiconductor film according to the 15th aspect, wherein the solid phase molar ratio value x of InN in $Al_{1-x}In_xN$ of the buffering layer is smaller on the gallium nitride compound-based semiconductor thin film side than on the substrate side. According to this process, the difference in lattice constant between the gallium nitride compound-based semiconductor film and the buffering layer at the boundary surface between them can be reduced.

The 20th aspect of the present invention is directed to a process for producing a gallium nitride compound-based semiconductor thin film according to the 15th aspect, wherein the thickness of the buffering layer is 5 nm to 50 nm. According to this process, the effect of the buffering layer can be kept good and the buffering layer can be formed so as to assume an amorphous state.

The 21st aspect of the present invention is directed to a process for producing a gallium nitride compound-based semiconductor film according to the 15th aspect, wherein the temperature of the buffering layer at the substrate surface is 400° C. to 700° C. According to this process, the buffering layer can be formed so as to assume an amorphous state and retain its surface flatness stably.

The entire disclosure of Japanese Patent Application Nos. 9-130765, 9-208828 and 9-263109 filed on May 21, Aug. 4 and Sep. 29, 1997, respectively, including specification, claims, drawings and summary are incorporated herein by reference in their entirety.

Embodiments of the present invention are explained below with reference to FIG. 1 to FIG. 5.

Embodiment 1

FIG. 1 is a sectional schematic illustration of the principal part of an organometallic chemical vapor deposition apparatus used in Embodiment 1 of the present invention and shows the structure of a reaction section and a gas system leading into the reaction section.

In FIG. 1, a substrate holder 13 which holds a substrate 12 with the thin film growth side downward is provided in the upper part of a reaction tube 11 having a gas inlet 11a at one end and a gas outlet 11b at the other end. A heating element 14 is provided outside the reaction tube 11 and near the substrate holder 13. The substrate holder 13 and the substrate 12 are heated by the heating element 14.

A gas piping for introducing carrier gases and starting gases into the reaction tube is connected to the gas inlet 11a. The gas piping is composed of a 1st piping 17a and a 2nd piping 17b through which nitrogen gas (19a) and hydrogen gas (19b), respectively, flow as main carrier gases; pipings branching off from the 2nd piping 17b, i.e., a 3rd piping 17c, a 4th piping 17d, a 5th piping 17e and a 6th piping 17f through which hydrogen gas (19b) flows as a sub-carrier gas for introducing TMG (19c), TMA (19d), TMI (19e) and bis(cyclopentadienyl)magnesium (19f) (hereinafter referred to as Cp2Mg), respectively, into the reaction tube 11; a 7th piping 17g through which ammonia (19g) flows; and an 8th piping 17h through which monosilane (19h) (hereinafter referred to as $SiH_4$) flows. The pipings 17a to 17h are equipped with flow rate controllers 15a to 15h, respectively, for controlling the gas flow rates. The 3rd piping 17c is equipped with a cylinder 18c containing TMG (19c), the 4th piping 17d with a cylinder 18d containing TMA (19d), the 5th piping 17e with a cylinder 18e containing TMI (19e), and the 6th piping 17f with a cylinder 18f containing Cp2Mg (19f). The 1st to 8th pipings 17a to 17h join in turn toward the reaction tube 11, and finally the single gas piping composed of them is connected to the gas inlet 11a.

In such an organometallic chemical vapor deposition apparatus, organometallic compound gases as starting gases are taken out of the cylinders 18c to 18e containing TMG, TMA and TMI, respectively, by introducing hydrogen gas as a carrier gas into the cylinders 18c to 18e at flow rates controlled by the flow rate controllers 15c, 15d and 15e, respectively, to carry out bubbling and vaporization. The organometallic compound gases are efficiently fed into the reaction tube 11 together with ammonia having a flow rate controlled by the flow rate controller 15g, by a main carrier gas composed of a mixed gas of nitrogen gas and hydrogen gas which have flow rates controlled by the flow rate controllers 15a and 15b, respectively.

In the reaction tube 11, a gallium nitride compound-based semiconductor film is formed on the heated substrate 12 after the reaction of the starting gases, i.e., ammonia and the organometallic compound gases. The residual starting gases are discharged as waste gas 16.

When a gallium nitride compound-based semiconductor thin film doped with a p-type or n-type impurity is grown, either Cp2Mg gas taken out by bubbling with a carrier gas composed of hydrogen gas having a flow rate controlled by the flow rate controller 15f, or $SiH_4$ gas having a flow rate controlled by the flow rate controller 15h is allowed to flow simultaneously with the flow of the above-mentioned organometallic compound gases. The Cp2Mg gas is used for growing a p-type gallium nitride compound-based semiconductor thin film, because it contains Mg as a p-type impurity. The $SiH_4$ gas is used for growing an n-type gallium nitride compound-based semiconductor thin film, because it contains Si as an n-type impurity.

Next, a film formation process using the organo-metallic chemical vapor deposition apparatus is explained below.

First, a planished sapphire substrate 12 is prepared. The substrate 12 is thoroughly washed and then set in the substrate holder 13 in the reaction tube 11. The substrate 12 is heated so as to maintain its surface temperature at 1,100° C. for 10 minutes, while allowing hydrogen gas to flow through the 2nd piping 17b, whereby there is carried out cleaning for removing dirt of organic substances, etc. and water which are adhering to the surface.

Then, the substrate surface temperature is lowered to 600° C. At this substrate surface temperature, a buffer layer of $Al_{1-x}In_xN$ (0<x<1) containing In (indium) is grown in, for example, 25 nm thickness while allowing nitrogen gas as main carrier gas and ammonia to flow at flow rates of 10 liters/min. and 5 liters/min., respectively, and simultaneously allowing carrier gas for TMA containing TMA and carrier gas for TMI containing TMI, to flow. The $Al_{1-x}In_xN$ is in the form of mixed crystals of AlN and InN (indium nitride). In the present embodiment, a sample was produced by allowing the carrier gas for TMA and the carrier gas for TMI, to flow at flow rates adjusted so that the solid phase molar ratio value x of InN might be 0.7. Specifically, the carrier gas for TMA and the carrier gas for TMI were allowed to flow at flow rates of 6 cc/min. and 140 cc/min., respectively.

Next, the flow of the carrier gases for TMA and TMI is stopped and the substrate surface temperature is raised to 1,050° C. Thereafter, a gallium nitride compound-based semiconductor thin film is grown on the buffering layer for 3 minutes while allowing nitrogen gas and hydrogen gas as main carrier gases to flow at flow rates of 8 liters/min. and 2 liters/min., respectively, and freshly allowing carrier gas for TMG containing TMG, to flow at a flow rate of 4 cc/min.

Then, the flow of the TMG gas as a starting gas is stopped, and the substrate surface temperature is maintained at 1,050° C. for 5 minutes while allowing nitrogen gas as main carrier gas to flow at a flow rate of 10 liters/min., whereby In contained in the buffering layer is diffused into the grown gallium nitride compound-based semiconductor thin film. For the In diffusion, there can also be adopted, for example, a method of reducing the growth rate of the gallium nitride compound-based semiconductor thin film in the early growth stages, and a method of raising the substrate surface temperature to a temperature higher than the growth temperature of the gallium nitride compound-based semiconductor thin film after the growth of the gallium nitride compound-based semiconductor thin film. It is also possible to supply In in the buffering layer to the gallium nitride compound-based semiconductor thin film by segregation or transfer such as mass transport.

Subsequently, the gallium nitride compound-based semiconductor thin film is further grown while maintaining the substrate surface temperature at 1,050° C. and allowing the following gases to flow: nitrogen gas and hydrogen gas as main carrier gases at flow rates of 8 liters/min. and 2 liters/min., respectively, and carrier gas for TMG containing TMG, at a flow rate of 4 cc/min. Thus, the gallium nitride compound-based semiconductor thin film is grown in 2 μm thickness on the buffering layer.

After the growth, the flow of the carrier gas for TMG and ammonia is stopped, and the wafer is cooled to room temperature while allowing nitrogen gas and hydrogen gas to flow at the same flow rates as above, and then is taken out of the reaction tube 11. The wafer refers to the substrate 12 having the aforesaid thin film formed thereon.

In addition to the thus obtained wafer of the present embodiment, the present inventor obtained another sample as Comparative Example 1 by the following process.

A buffer layer of AlN containing no In is grown at an InN solid phase molar ratio value x of 0.0 in the same manner as in the above-mentioned buffering layer growing step except for allowing only carrier gas for TMA to flow at a flow rate of 20 cc/min. in place of the carrier gases for TMA and TMI. Next, the flow of the carrier gas for TMA is stopped and the substrate surface temperature is raised to 1,050° C. Thereafter, a gallium nitride compound-based semiconductor thin film is grown in 2 μm thickness on the buffering layer for 60 minutes while allowing nitrogen gas and hydrogen gas as main carrier gases to flow at flow rates of 8 liters/min. and 2 liters/min., respectively, and freshly allowing carrier gas for TMG containing TMG, to flow at a flow rate of 4 cc/min. After the growth, the flow of the carrier gas for TMG and ammonia is stopped, and the wafer is cooled to room temperature while allowing nitrogen gas and hydrogen gas to flow at the same flow rates as above, and then is taken out of the reaction tube 11 as Comparative Example 1.

The gallium nitride compound-based semiconductor thin films formed by the above production processes were evaluated by measurement of X-ray rocking curves with a double crystal X-ray diffractometer and secondary ion mass spectrometry (hereinafter referred to as SIMS). In each X-ray rocking curve, the smaller the half-width, the higher the crystallinity of the gallium nitride compound-based semiconductor thin film.

In the case of the sample of Comparative Example 1 obtained by using the AlN buffer layer containing no In, the X-ray rocking curve half-width value was about 9 minutes which was widely different from an X-ray rocking curve half-width value of 5 minutes determined for the sample of the present embodiment obtained by using the buffering layer containing In.

Figure 2:
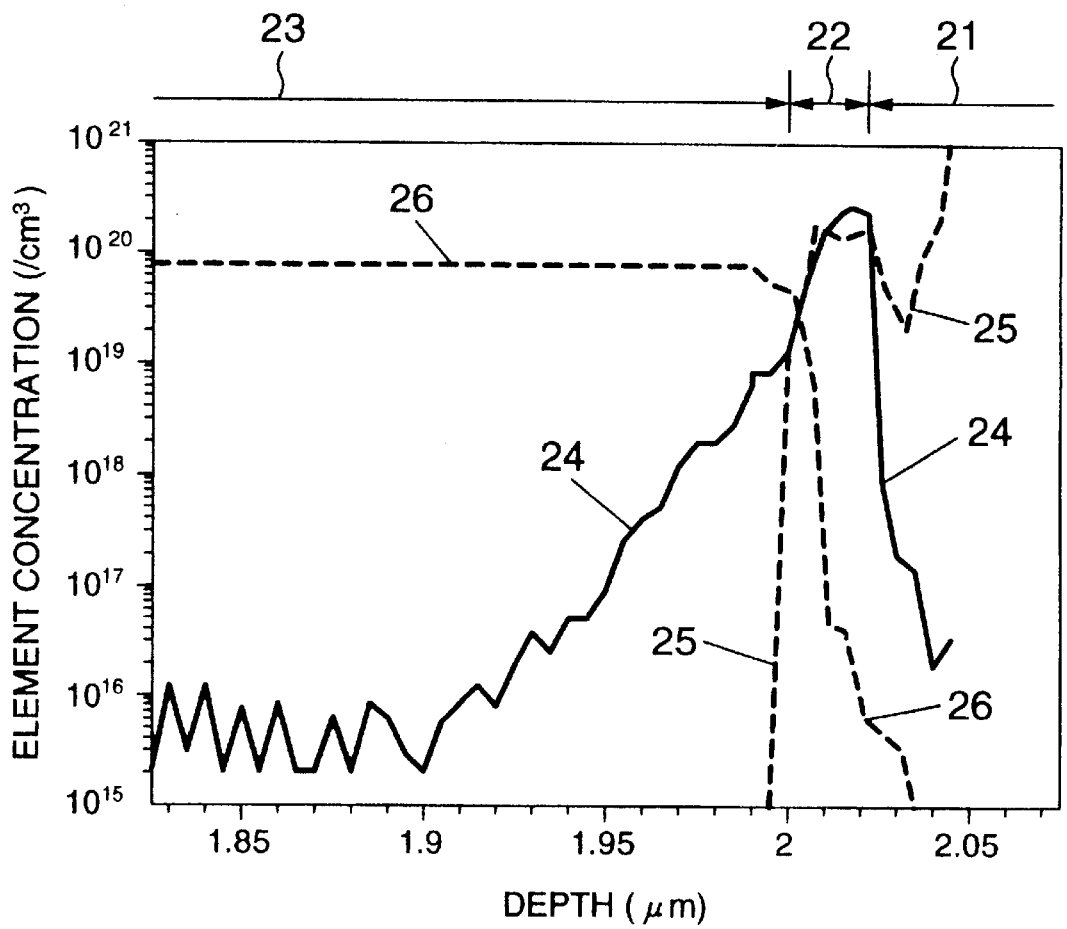
FIG. 2 is a graph showing a depth profile of a gallium nitride compound-based semiconductor thin film grown on an indium-containing buffering layer which was determined near the buffering layer by SIMS.

FIG. 2 shows a depth profile of the gallium nitride compound-based semiconductor thin film grown on the In-containing buffering layer described in the present embodiment. In FIG. 2, 21 is the substrate, 22 the buffering layer, 23 the film of gallium nitride compound-based semiconductor, and 24, 25 and 26 are concentrations of In, Al and Ga, respectively. As can be seen from FIG. 2, in the wafer obtained by using the In-containing buffering layer, the gallium nitride compound-based semiconductor thin film grown on the buffering layer contains In diffused from the buffering layer, and the concentration of In contained in the thin film decreases in the direction of growth of the thin film. On the other hand, in the sample of Comparative Example 1 obtained by using the AlN buffering layer, there was formed a relatively steep boundary (not shown) between the buffering layer and the gallium nitride compound-based semiconductor thin film grown thereon.

The reason why a gallium nitride compound-based semiconductor thin film grown on the In-containing buffering layer used in the present invention has an improved crystallinity as compared with that grown on a conventional buffering layer containing no In can be assumed as follows.

(1) The In-containing buffering layer contains InN having a lower hardness than that of AlN, so that when a gallium nitride compound-based semiconductor thin film is grown on this buffering layer at a high temperature, distortion caused between a substrate and the gallium nitride compound-based semiconductor thin film owing to the difference in lattice constant between them becomes more easily absorbable than when AlN or AlGaN is used as a buffering layer. Thus, crystal defects caused by the distortion can be reduced.

(2) When the In-containing buffering layer is used, In can be incorporated into a part of the buffering layer side of the gallium nitride compound-based semiconductor thin film grown at a high temperature, by diffusing thereinto In contained in the buffering layer. Since the concentration of In contained in the gallium nitride compound-based semiconductor thin film is high near the boundary surface between the thin film and the buffering layer, the difference in lattice constant between the buffering layer and the gallium nitride compound-based semiconductor thin film can be reduced near the boundary surface, so that the occurrence of distortion and crystal defects owing to the lattice constant difference can be reduced. Also when In is incorporated into a gallium nitride compound-based semiconductor thin film by feeding an In-containing starting material during growth as in the Embodiment 2 described hereinafter, employment of the In-containing buffering layer can prevent the diffusion of In into the buffering layer, so that the concentration of In contained in the gallium nitride compound-based semiconductor thin film in the vicinity of the boundary surface between the thin film and the buffering layer can be maintained stably with good controllability.

(3) Since a gallium nitride compound-based semiconductor containing In is softer than a gallium nitride compound-based semiconductor containing no In, the occurrence of distortion and crystal defects in a thin film of the gallium nitride compound-based semiconductor containing In can be reduced by synergism of the effect of the buffering layer described in the above item (1) and the effect of reduction of the difference in lattice constant between the thin film and the buffering layer described in the above item (2).

Although there was explained above the growth of an impurity-undoped gallium nitride compound-based semiconductor thin film on a buffering layer, the same effects as above can be obtained also in the case of a gallium nitride compound-based semiconductor thin film doped with a p-type or n-type impurity.

Embodiment 2

Also in Embodiment 2, the organometallic chemical vapor deposition apparatus explained in Embodiment 1 is used.

A buffering layer of AlInN is grown in the same manner as in Embodiment 1, after which the flow of carrier gases for TMA and TMI is stopped and the substrate surface temperature is raised to 850° C. Then, a gallium nitride compound-based semiconductor thin film is grown in 0.1 μm thickness on the buffer layer for 3 minutes while allowing nitrogen gas as main carrier gas to flow at a flow rate of 10 liters/min. and freshly allowing carrier gas for TMG containing TMG and carrier gas for TMI containing TMI, to flow. During the growth, the carrier gases for TMG and TMA were allowed to flow while linearly varying the flow rate of the carrier gas for TMG from 2 cc/min. to 4 cc/min. and the flow rate of the carrier gas for TMI from 120 cc/min. to 0.1 cc/min., whereby the concentration of In contained in the gallium nitride compound-based semiconductor thin film is decreased in the direction of growth of the thin film.

Next, the flow of the carrier gas for TMG and the carrier gas for TMI is stopped and the substrate surface temperature is raised to 1,050° C. Thereafter, the gallium nitride compound-based semiconductor thin film is further grown on the buffering layer for 57 minutes while allowing nitrogen gas and hydrogen gas as main carrier gases to flow at flow rates of 8 liters/min. and 2 liters/min., respectively, and freshly allowing carrier gas for TMG containing TMG, to flow at a flow rate of 4 cc/min. Thus, the gallium nitride compound-based semiconductor thin film is grown in 2 $\mu$m thickness on the buffering layer. The wafer is cooled to room temperature while allowing ammonia, nitrogen gas and hydrogen gas to flow at the same flow rates as before, and then is taken out of the reaction tube.

The X-ray rocking curve of the thus obtained gallium nitride compound-based semiconductor thin film of the present embodiment was measured to find that the half-width was about 5 minutes, namely, the crystallinity was good as in Embodiment 1.

The gallium nitride compound-based semiconductor thin film of the present embodiment was subjected to SIMS analysis to find that as in the sample of the Embodiment 1, the concentration of In contained in the gallium nitride compound-based semiconductor thin film grown on the buffering layer decreased gradually in the direction of growth of the thin film from the side on which the thin film was in contact with the buffering layer.

Therefore, also in the present embodiment, the gallium nitride compound-based semiconductor thin film grown on the buffering layer has a markedly improved crystallinity.

Although in the present embodiment, the flow rates of TMI and TMG were linearly varied in incorporating In into a part of the buffering layer side of the gallium nitride compound-based semiconductor thin film which is being grown on the buffering layer, the concentration of In contained in the gallium nitride compound-based semiconductor thin film may be decreased stepwise in the direction of growth of the thin film by varying the flow rates of TMI and TMG stepwise.

Embodiment 3

Figure 3:
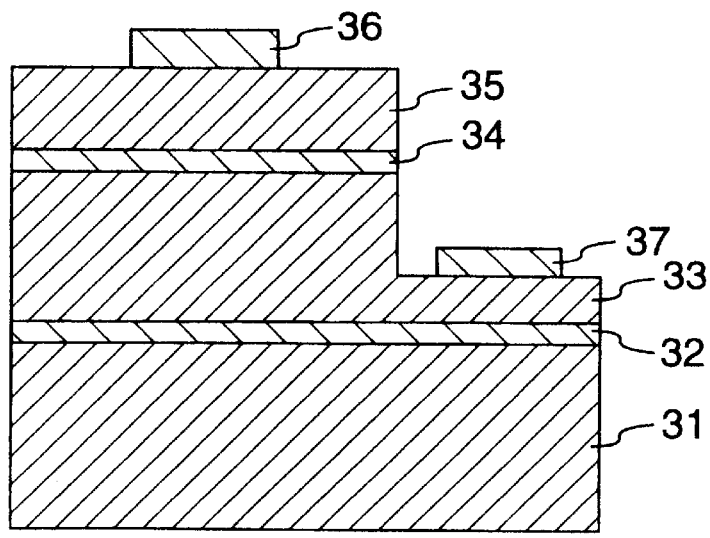
FIG. 3 is a cross-sectional view showing the structure of each of gallium nitride compound-based semiconductor light emitting devices according to Embodiments 3 and 6 of the present invention.

FIG. 3 is a cross-sectional view showing the structure of a gallium nitride compound-based semiconductor light emitting device according to Embodiment 3 of the present invention.

In FIG. 3, a buffering layer 32, an n-type gallium nitride compound-based semiconductor thin film 33, an undoped InGaN layer 34 and a p-type gallium nitride compound-based semiconductor thin film 35 are laminated in that order on a substrate 31. A p-side electrode 36 is formed on the p-type gallium nitride compound-based semiconductor thin film 35, and an n-side electrode 37 is formed on the partly exposed n-type gallium nitride compound-based semiconductor thin film 33. In such a gallium nitride compound-based semiconductor light emitting device, the substrate 31 is preferably made of sapphire, and the buffering layer 32 formed on the substrate 31 made of sapphire is made of $Al_{1-x}In_xN$ (0<x<1) containing In which is composed of mixed crystals of AlN and InN.

Here, the word "undoped" means that the InGaN layer contains neither a p-type impurity nor a n-type impurity at the time of forming the thin film. The undoped InGaN layer 34 serves as a light-emitting layer.

A process for producing the gallium nitride compound-based semiconductor light emitting device according to the present embodiment is as follows.

The buffer layer 32 of $Al_{1-x}In_xN$ (0<x<1) containing In is formed in the same manner as in Embodiment 1. Then, the flow of carrier gase for TMA and carrier gas for TMI is stopped and the substrate surface temperature is raised to 1,050° C. Thereafter, a gallium nitride compound-based semiconductor thin film is grown for 3 minutes while allowing nitrogen gas and hydrogen gas as main carrier gases to flow at flow rates of 8 liters/min. and 2 liters/min., respectively, and freshly allowing carrier gas for TMG and 10 ppm $SiH_4$ gas as a Si source to flow at flow rate of 4 cc/min. and 10 cc/min., respectively.

Next, the flow of the carrier gas for TMG and the $SiH_4$ gas is stopped, and the substrate surface temperature is maintained at 1,050° C. for 5 minutes while allowing nitrogen gas as a main carrier gas to flow at a flow rate of 10 liters/min., whereby In contained in the buffering layer is diffused into the grown gallium nitride compound-based semiconductor thin film. The gallium nitride compound-based semiconductor thin film is further grown while maintaining the substrate surface temperature at 1,050° C. and allowing the following gases to flow: nitrogen gas and hydrogen gas as main carrier gases at flow rates of 8 liters/min. and 2 liters/min., respectively, and carrier gas for TMG containing TMG, and $SiH_4$ gas at flow rates of 4 cc/min. and 10 cc/min., respectively. Thus, the n-type gallium nitride compound-based semiconductor thin film doped with Si is formed in 2 $\mu$m thickness on the buffering layer.

After the formation of the n-type gallium nitride compound-based semiconductor thin film 33, the flow of the carrier gas for TMG and the $SiH_4$ gas is stopped, and the substrate surface temperature is lowered to 750° C. An InGaN layer is grown for 1 minutes while freshly allowing nitrogen gas as main carrier gas, carrier gas for TMG and carrier gas for TMI to flow at flow rates of 10 liters/min., 2 cc/min. and 100 cc/min., respectively. Thus, the undoped InGaN layer 34 is formed in 3 nm thickness.

After the formation of the InGaN layer 34, the flow of the carrier gas for TMG and the carrier gas for TMI is stopped and the substrate surface temperature is raised to 1,050° C. A gallium nitride compound-based semiconductor thin film doped with Mg is grown in 0.5 $\mu$m thickness for 15 minutes while freshly allowing the following gases to flow: nitrogen gas and hydrogen gas as main carrier gases at flow rates of 8 liters/min. and 1.95 liters/min., respectively, and carrier gas for TMG containing TMG and carrier gas for Cp2Mg at flow rates of 4 cc/min. and 50 cc/min., respectively. After the growth, the flow of the carrier gas for TMG, the carrier gas for Cp2Mg, and ammonia is stopped, and the wafer is cooled to room temperature while allowing nitrogen gas and hydrogen gas to flow at the same flow rates as above, and then is taken out of the reaction tube.

AS to the pn junction involving a quantum well structure composed of the thus formed laminated structure of the n-type gallium nitride compound-based semiconductor thin film 33, the undoped InGaN layer 34 and the p-type gallium nitride compound-based semiconductor thin film 35, a part of the n-type gallium nitride compound-based semiconductor thin film 33 is exposed by etching corresponding parts of the p-type gallium nitride compound-based semiconductor thin film 35 and the undoped InGaN layer 34, respectively, and the p-side electrode 36 and the n-side electrode 37 are formed as ohmic contacts on the p-type gallium nitride compound-based semiconductor thin film 35 and the n-type gallium nitride compound-based semiconductor thin film 33, respectively.

Then, the sapphire substrate 31 is thinned to about 100 $\mu$m by polishing the reverse side, and the wafer is divided into chips by scribing. The chip is attached to a stem with the pn junction side upward, after which each of the n-side electrode 37 and the p-side electrode 36 of the chip is connected to an electrode on the stem by a wire, followed by resin molding. Thus, a light emitting diode is produced.

When the present inventor operated the light emitting diode by applying a forward current of 20 mA, the forward voltage was 3.9 V, the light emission output was 890 µW, the spectrum half-width was 14 nm, and the light emitting diode emitted bluish-purple light at a wavelength of 430 nm.

In addition to the light emitting diode of the present embodiment obtained in the manner described above, the present inventor obtained another sample as Comparative Example 2 by the following process.

A buffer layer of AlN containing no In is grown in the same manner as in the above-mentioned Comparative Example 1. Then, the flow of carrier gas for TMA is stopped and the substrate surface temperature is raised to 1,050° C. A Si-doped n-type gallium nitride compound-based semiconductor thin film is grown in 2 µm thickness on the buffer layer for 60 minutes while allowing nitrogen gas and hydrogen gas as main carrier gases to flow at flow rates of 8 liters/min. and 2 liters/min., respectively, and freshly allowing carrier gas for TMG and 10 ppm $SiH_4$ gas as a Si source to flow at flow rates of 4 cc/min. and 10 cc/min., respectively. Thereafter, a light emitting diode is produced as Comparative Example 2 by the same process as described above in the present embodiment.

When this light emitting diode was operated by applying a forward current of 20 mA, the forward voltage and the wavelength were substantially the same as in the case of the sample obtained by the process described above in Embodiment 3, but the light emission output was as low as 150 µW (i.e. about one-sixth that of said sample) and the spectrum half-width was as large as 31 nm.

Although $Al_{1-x}In_xN$ (0<x<1) was used as a buffering layer containing In in the present embodiment, it is clear that the same effects can be obtained also by using $In_yGa_{1-y}N$ (0<y≦1) or $Al_aIn_bGa_{1-a-b}N$ (0≦a≦1, 0<b≦1, a+b≦1).

Embodiment 4

Also in Embodiment 4, the organometallic chemical vapor deposition apparatus explained in Embodiment 1 is used.

A film formation process in Embodiment 4 is explained below.

First, a planished sapphire substrate 12 is prepared. The substrate 12 is thoroughly washed and then set in the substrate holder 13 in the reaction tube 11. The substrate 12 is heated so as to maintain its surface temperature at 1,100° C. for 10 minutes, while allowing hydrogen gas to flow through the 2nd piping 17b, whereby there is carried out cleaning for removing dirt of organic substances, etc. and water which are adhering to the surface.

Then, the substrate surface temperature is lowered to 600° C., and a buffering layer of $Al_{1-x}In_xN$ is grown in, for example, 25 nm thickness while allowing the following gases to flow: nitrogen gas as main carrier gas, carrier gas for TMA containing TMA, carrier gas for TMI containing TMI, and ammonia. The $Al_{1-x}In_xN$ is in the form of mixed crystals of AlN and InN (indium nitride). In the present embodiment, there were produced three kinds of samples in which the InN solid phase molar ratio value x is 0.2, 0.5 or 0.8, respectively, as a parameter.

In the production of each sample, nitrogen as main carrier gas and ammonia were allowed to flow at flow rates of 10 liters/min. and 5 liters/min., respectively. The flow rates of the carrier gas for TMA containing TMA and the carrier gas for TMI containing TMI were adjusted to 15 cc/min. and 50 cc/min., respectively, in the case of x being 0.2; 10 cc/min. and 100 cc/min., respectively, in the case of x being 0.5; or 5 cc/min. and 150 cc/min., respectively, in the case of x being 0.8.

Next, the flow of the carrier gases for TMA and TMI is stopped and the substrate surface temperature is raised to 1,050° C. Thereafter, a gallium nitride compound-based semiconductor thin film is grown in 2 µm thickness on the buffering layer for 60 minutes while allowing nitrogen gas and hydrogen gas as main carrier gases to flow at flow rates of 9 liters/min. and 0.95 liter/min., respectively, and freshly allowing carrier gas for TMG containing TMG, to flow at a flow rate of 4 cc/min.

After the growth, the flow of the starting gases, i.e, the TMG gas and ammonia is stopped, and the wafer is cooled to room temperature while allowing nitrogen gas and hydrogen gas to flow at the same flow rates as above, and then is taken out of the reaction tube 11. The wafer refers to the substrate 12 having the aforesaid thin film formed thereon.

In addition to the thus obtained wafer of Embodiment 4, the present inventor obtained other samples as Comparative Examples 3 and 4 by the following processes:

COMPARATIVE EXAMPLE 3

A production process of the sample of Comparative Example 3 comprises growing a buffering layer of AlN at an InN solid phase molar ratio value x of 0.0 in the same manner as in the above-mentioned buffering layer growing step except for allowing only carrier gas for TMA to flow at a flow rate of 20 cc/min. in place of the mixture of carrier gases for TMA and TMI; and then forming a gallium nitride compound-based semiconductor thin film on the buffering layer in the same manner as above.

COMPARATIVE EXAMPLE 4

A production process of the sample of Comparative Example 4 comprises growing a buffering layer of InN at an InN solid phase molar ratio value x of 1.0 in the same manner as in the above-mentioned buffering layer growing step except for allowing only carrier gas for TMI to flow at a flow rate of 20 cc/min. in place of the mixture of carrier gases for TMA and TMI; and then forming a gallium nitride compound-based semiconductor thin film on the buffering layer in the same manner as above.

The gallium nitride compound-based semiconductor thin films formed by the above-mentioned production processes were evaluated.

The evaluation was carried out by observing the surface of each gallium nitride compound-based semi-conductor thin film under a microscope and measuring the arithmetic mean roughness (hereinafter referred to as Ra) of surface of each gallium nitride compound-based semi-conductor thin film. The measurement was carried out with a Dektak 3030 surface roughness measuring apparatus using a feeler with an end radius of 2 µm. The feeler pressure was 30 mg and the measurement length 1,000 µm.

Figure 4:
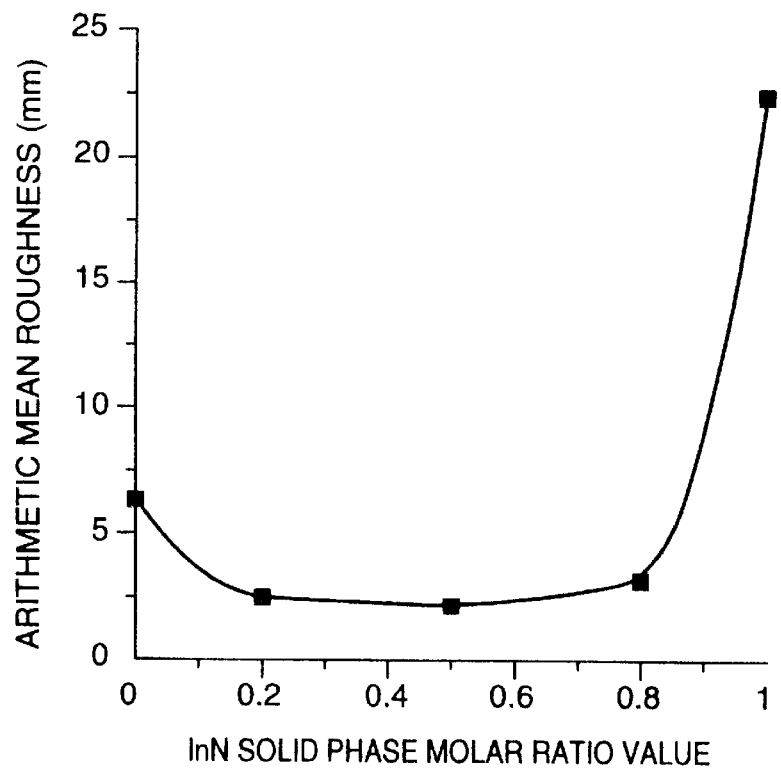
FIG. 4 is a graph showing the relationship between the InN solid phase molar ratio value of a buffering layer and the Ra value of the surface of a gallium nitride compound-based semiconductor thin film.

FIG. 4 is a graph showing the relationship between the InN solid phase molar ratio values of the buffering layers and the Ra values of surface of the gallium nitride compound-based semiconductor thin films.

As a result of the microscopic observation of the surface of each gallium nitride compound-based semiconductor thin film, it was found that in the samples of Comparative Examples 3 and 4 obtained by using the buffering layer made of AlN or InN, respectively, the surface was markedly uneven as compared with the sample of Embodiment 1. As can be seen from FIG. 4, in the samples of Comparative Examples 3 and 4, the measured values of Ra were about 7 nm and about 23 nm, respectively, which are widely different from the surface roughness Ra value of 2 to 3 nm in the sample of Embodiment 1 obtained by using a buffering layer of a mixture of AlN and InN. From FIG. 4, it can be seen that when the InN solid phase molar ratio value x of a buffering layer of $Al_{1-x}In_xN$ is preferably adjusted to not more than 0.8 and not less than 0.2, the resulting gallium nitride compound-based semiconductor thin film has a reduced surface roughness.

Embodiment 5

Also in Embodiment 5, the organometallic chemical vapor deposition apparatus explained in Embodiment 1 is used.

In Embodiment 5, a gallium nitride compound-based semiconductor thin film was formed on a buffering layer by the same process as in Embodiment 4 except for changing the InN solid phase molar ratio value x employed as a parameter in the above-mentioned buffering layer growing step in Embodiment 4 to 0.6, 0.7 or 0.9. Thus, three kinds of samples were produced.

In the production of each sample, nitrogen as main carrier gas and ammonia were allowed to flow at flow rates of 10 liters/min. and 5 liters/min., respectively. The flow rates of carrier gas for TMA containing TMA and carrier gas for TMI containing TMI were adjusted to 6.7 cc/min. and 134 cc/min., respectively, in the case of x being 0.6; 6 cc/min. and 140 cc/min., respectively, in the case of x being 0.7; or 2.5 cc/min. and 175 cc/min., respectively, in the case of x being 0.9.

Next, there were measured the double crystal X-ray rocking curves of the gallium nitride compound-based semiconductor thin films formed by the production processes described in Embodiment 4, Embodiment 5, Comparative Example 3 and Comparative Example 4, respectively.

Figure 5:
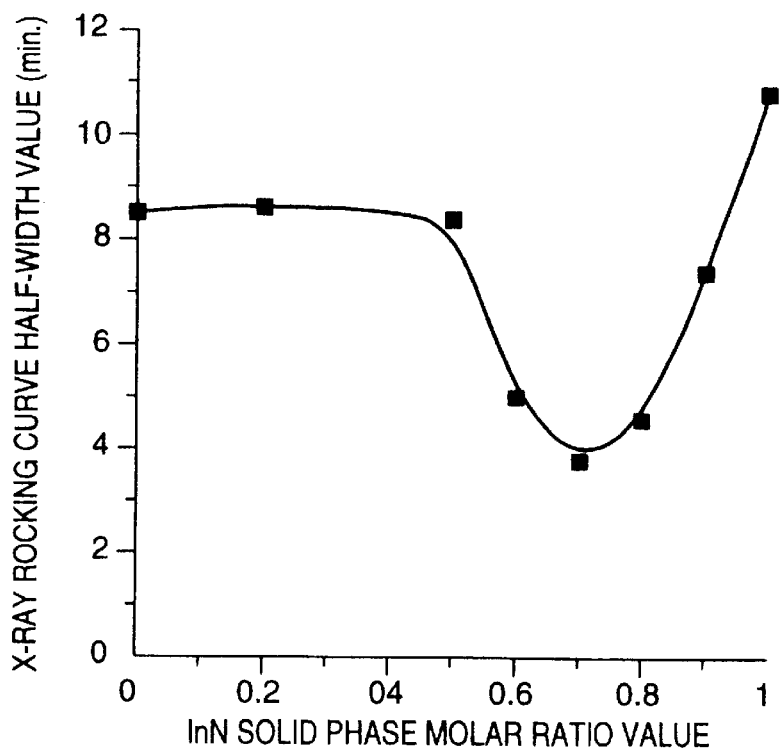
FIG. 5 is a graph showing the relationship between the InN solid phase molar ratio value of a buffering layer and the X-ray rocking curve half-width of a gallium nitride compound-based semiconductor thin film.

FIG. 5 is a graph showing the relationship between the InN solid phase molar ratio values of the buffering layers and the X-ray rocking curve half-width values of the gallium nitride compound-based semiconductor thin films.

As can be seen from FIG. 5, the half-width values in the case of the sample of Comparative Example 3 (InN solid phase molar ratio value: 0.0) obtained by using an AlN buffering layer and the sample of Comparative Example 4 (InN solid phase molar ratio value: 1.0) obtained by using an InN buffering layer were about 9 minutes and about 11 minutes, respectively. Of the samples obtained in Embodiments 3 and 4 by using a buffering layer of a mixture of AlN and InN, samples obtained at an InN solid phase molar ratio value of 0.2, 0.5 or 0.9 showed substantially the same half-width value as that shown by the sample of Comparative Example 3 obtained by using an AlN buffering layer. On the other hand, samples obtained at an InN solid phase molar ratio value of 0.6, 0.7 or 0.8 showed a half-width value of approximately 4 to 5 minutes which was widely different from the above half-width values.

Therefore, it can be seen that when the InN solid phase molar ratio value x of a buffering layer of $Al_{1-x}In_xN$ (0<x<1) is preferably adjusted to not more than 0.8 and not less than 0.6, the resulting gallium nitride compound-based semiconductor thin film has a markedly improved crystallinity.

The reason why a gallium nitride compound-based semiconductor thin film grown on such a buffering layer of $Al_{1-x}In_xN$ (0<x<1) has higher surface flatness and crystallinity than does that grown on a conventional AlN buffering layer can be assumed as follows.

When AlInN is used as a buffering layer, the buffering layer contains InN having a low hardness. Therefore, when a gallium nitride compound-based semiconductor thin film is grown on the buffering layer at a high temperature, distortion caused between the gallium nitride compound-based semiconductor thin film and the buffering layer owing to the difference in lattice constant between them is more easily absorbable than when AlN is used as a buffering layer as in Comparative Example 3. Thus, crystal defects caused by the distortion can be reduced, so that the crystal growth of the gallium nitride compound-based semiconductor thin film can be improved. Consequently, it becomes possible to impart excellent surface flatness and crystallinity to the gallium nitride compound-based semiconductor thin film.

When a buffering layer of InN is used as in Comparative Example 4, this InN is liable to be decomposed at a high temperature to release nitrogen. Therefore, in the course of heating the buffering layer for preparation for the formation of a gallium nitride compound-based semiconductor thin film, nitrogen is dissociated from InN, so that the surface of the buffering layer contains In in excess. Accordingly, the difference in lattice constant between the buffering layer and the gallium nitride compound-based semiconductor thin film is increased, so that defects tend to be caused in a crystal of the gallium nitride compound-based semiconductor thin film grown on the buffering layer. Consequently, no gallium nitride compound-based semiconductor thin film having an excellent surface flatness can be obtained.

For assuring the surface flatness of a gallium nitride compound-based semiconductor thin film, it is preferable to adjust the thickness of the AlInN buffering layer to not more than 50 nm and not less than 5 nm. The reason is as follows. When the thickness of the AlInN buffering layer is less than 5 nm, the effect of the buffering layer is not sufficient, so that a gallium nitride compound-based semiconductor thin film grown on the buffering layer has a surface profile having remarkable hexagonal-pyramidal concavities and convexities, as in the case of growth directly on a substrate. On the other hand, when the thickness of the AlInN buffering layer is more than 50 nm, the AlInN becomes difficult to make into a single crystal in a subsequent heating step and hence does not perform the function as a seed crystal described below, so that a gallium nitride compound-based semiconductor thin film grown on the buffering layer has a deteriorated surface flatness.

Since the buffering layer is grown at a low temperature of 400° C. to 700° C. to assume an amorphous state, the buffering layer surface becomes flat in conformity with the flatness of a planished substrate. A gallium nitride compound-based semiconductor thin film to be grown on the buffering layer should be grown at a high temperature of, for example, 1,000° C. Therefore, the buffering layer partly assumes a single crystal state in place of the amorphous state in the growth process of the thin film at the high temperature and acts as a seed crystal for growing the gallium nitride compound-based semiconductor thin film. When the growth temperature of the buffering layer is lower than 400° C., organometallic compound gases and ammonia which are used as starting material for the buffering layer becomes hardly decomposable, so that the growth of the buffering layer tends to become impossible. On the other hand, when the growth temperature is higher than 700° C., the AlInN buffering layer becomes polycrystals and hence tends to grow into an island structure, resulting in a deteriorated flatness. Moreover, when the growth temperature is higher than 700° C., InN is liable to be dissociated from AlInN, so that AlInN tends to become AlN during the growth of the buffering layer.

Thus, when $Al_{1-x}In_xN$ (0<x<1) is used as a buffering layer, a gallium nitride compound-based semiconductor thin film grown thereon can have a flat surface and a good crystallinity.

In this case, it is also effective that the InN solid phase molar ratio value of the $Al_{1-x}In_xN$ buffering layer is varied so as to be decreased in the direction of growth of the buffering layer.

The reason is as follows. When the InN solid phase molar ratio value is smaller on the gallium nitride compound-based semiconductor thin film side of the buffering layer than on the substrate side, the difference in lattice constant between the gallium nitride compound-based semiconductor and the AlInN buffering layer can be reduced, so that the occurrence of distortion and crystal defects owing to the lattice constant difference can be reduced in the boundary surface between the semiconductor and the buffering layer. Moreover, since the InN solid phase molar ratio value is larger on the substrate side than on the gallium nitride compound-based semiconductor thin film side, it becomes possible to maintain the above-mentioned effect of the AlInN buffering layer, i.e., the effect of reducing distortion, etc. in the boundary surface between the In-containing buffering layer and the gallium nitride compound-based semiconductor grown thereon.

For example, when the buffering layer is formed in 5 nm thickness, a layer to be grown into the buffering layer is grown in 15 nm thickness at first by allowing carrier gas for TMG and carrier gas for TMI to flow at their respective flow rates adjusted so that the InN solid phase molar ratio value may be 0.7. Then, the layer is further grown by a thickness of 10 nm by allowing carrier gas for TMG and carrier gas for TMI to flow at their respective flow rates adjusted so that the InN solid phase molar ratio value may be 0.2. Thus, the InN solid phase molar ratio value can be made larger on the substrate side of the buffering layer and smaller on the gallium nitride compound-based semiconductor thin film side.

When the InN solid phase molar ratio value is made smaller on the gallium nitride compound-based semiconductor thin film side of the buffering layer and larger on the substrate side, the InN solid phase molar ratio value may be either monotonously decreased in the direction of growth of the buffering layer or varied stepwise by controlling the flow rates of carrier gas for TMG and carrier gas for TMI which are allowed to flow during the growth of the buffering layer.

Although there was explained above the growth of an impurity-undoped gallium nitride compound-based semiconductor thin film on an AlInN buffering layer, it is clear that the same effects as above can be obtained also in the case of a gallium nitride compound-based semiconductor thin film doped with a p-type or n-type impurity.

Embodiment 6

FIG. 3 is a cross-sectional view showing the structure of a gallium nitride compound-based semiconductor light emitting device according to Embodiment 6 of the present invention.

In FIG. 3, a buffering layer 32, an n-type gallium nitride compound-based semiconductor thin film 33, an undoped InGaN layer 34 and a p-type gallium nitride compound-based semiconductor thin film 35 are laminated in that order on a substrate 31. A p-side electrode 36 is formed on the p-type gallium nitride compound-based semi-conductor thin film 35, and an n-side electrode 37 is formed on the partly exposed n-type gallium nitride compound-based semiconductor thin film 33. In such a gallium nitride compound-based semiconductor light emitting device, the substrate 31 is preferably made of sapphire, and the buffering layer 32 formed on the substrate 31 made of sapphire is made of $Al_{1-x}In_xN$ (0<x<1) which is composed of mixed crystals of AlN and InN.

Here, the word "undoped" means that the InGaN layer contains neither a p-type impurity nor a n-type impurity at the time of forming the thin film. The undoped InGaN layer 34 serves as a light-emitting layer.

A process for producing the gallium nitride compound-based semiconductor light emitting device according to the present embodiment is as follows.

The buffering layer 32 of $Al_{1-x}In_xN$ (0<x<1) is formed in the same manner as in Embodiment 4. Then, the flow of only a carrier gas for TMA and a carrier gas for TMI is stopped and the substrate surface temperature is raised to 1,050° C. Thereafter, a gallium nitride compound-based semiconductor thin film doped with Si is grown in 2 μm thickness for 60 minutes while allowing nitrogen gas and hydrogen gas as main carrier gases to flow at flow rates of 9 liters/min. and 0.95 liter/min., respectively, and freshly allowing carrier gas for TMG and 10 ppm $SiH_4$ gas as a Si source to flow at flow rates of 4 cc/min. and 10 cc/min., respectively.

After the formation of the n-type gallium nitride compound-based semiconductor thin film 33, the flow of the carrier gas for TMG gas and the $SiH_4$ gas is stopped, and the substrate surface temperature is lowered to 750° C. An InGaN layer is grown for 1 minutes while freshly allowing nitrogen gas as main carrier gas, carrier gas for TMG and carrier gas for TMI to flow at flow rates of 10 liters/min., 2 cc/min. and 100 cc/min., respectively. Thus, the undoped InGaN layer 34 is formed in 3 nm thickness.

After the formation of the InGaN layer 34, the flow of the carrier gas for TMG and the carrier gas for TMI is stopped and the substrate surface temperature is raised to 1,050° C. A gallium nitride compound-based semiconductor thin film doped with Mg is grown in 0.5 μm thickness for 15 minutes while freshly allowing the following gases to flow: nitrogen gas and hydrogen gas as main carrier gases at flow rates of 9 liters/min. and 0.95 liter/min., respectively, and carrier gas for TMG and carrier gas for Cp2Mg at flow rates of 4 cc/min. and 50 cc/min., respectively.

After the growth, the flow of the starting gases, i.e., the TMG gas, the Cp2Mg gas and ammonia is stopped, and the wafer is cooled to room temperature while allowing nitrogen gas and hydrogen gas to flow at the same flow rates as above, and then is taken out of the reaction tube.

The wafer taken out was observed under a microscope to find that its surface was flat with substantially no unevenness and had a Ra value of 3.2 nm.

As to the pn junction involving a quantum well structure composed of the thus formed laminated structure of the n-type gallium nitride compound-based semiconductor thin film 33, the undoped InGaN layer 34 and the p-type gallium nitride compound-based semiconductor thin film 35, a part of the n-type gallium nitride compound-based semiconductor thin film 33 is exposed by etching corresponding parts of the p-type gallium nitride compound-based semiconductor thin film 35 and the undoped InGaN layer 34, respectively, and the p-side electrode 36 and the n-side electrode 37 are formed as ohmic contacts on the p-type gallium nitride compound-based semiconductor thin film 35 and the n-type gallium nitride compound-based semiconductor thin film 33, respectively.

Then, the sapphire substrate 31 is thinned to about 100 μm by polishing the reverse side, and the wafer is divided into chips by scribing. The chip is attached to a stem with the pn junction side upward, after which each of the n-side electrode 37 and the p-side electrode 36 of the chip is connected to an electrode on the stem by a wire, followed by resin molding. Thus, a light emitting diode is produced.

When the present inventor operated the light emitting diode by applying a forward current of 20 mA, the forward voltage was 3.9 V, the light emission output was 890 μW, the spectrum half-width was 14 nm, and the light emitting diode emitted bluish-purple light at a wavelength of 430 nm.

In addition to the light emitting diode of Embodiment 6 obtained in the manner described above, the present inventor produced another light emitting diode as Comparative Example 5 in the same manner as in Embodiment 6 except for using a buffering layer of AlN.

COMPARATIVE EXAMPLES 5

When the light emitting diode of Comparative Example 5 was operated by applying a forward current of 20 mA, the forward voltage and the wavelength were substantially the same as in the case of the light emitting diode of Embodiment 6, but the light emission output was as low as 150 μW (i.e. about one-sixth that of the latter light emitting diode) and the spectrum half-width was 31 nm (i.e. twice or more that in the latter light emitting diode).

As described above, the gallium nitride compound-based semiconductor light emitting element of the present invention is beneficially effective as follows: since it is produced by forming an indium-containing buffering layer on a substrate, and forming thereon gallium nitride compound-based semiconductor thin films containing indium, the gallium nitride compound-based semiconductor thin films have an improved crystallinity, so that the light emitting device has excellent light-emitting properties.

Accordingly, there can be obtained such a beneficial effect that characteristics of light emitting devices and electron devices (e.g. light emitting diodes and semiconductor lasers) which use gallium nitride compound-based semiconductor thin films can be improved.

The process for producing a gallium nitride compound-based semiconductor thin film of the present invention is beneficially effective as follows: since it comprises forming an indium-containing buffering layer on a substrate, and forming thereon a gallium nitride compound-based semiconductor thin film containing indium, the occurrence of distortion and crystal defects between the buffering layer and the gallium nitride compound-based semiconductor thin film is reduced, so that the gallium nitride compound-based semiconductor thin film has a markedly improved crystallinity as compared with that grown on a conventional buffering layer containing no indium.

In this invention, by incorporating indium into the gallium nitride compound-based semiconductor thin film on the side on which the thin film is in contact with the buffering layer, there can be obtained such a beneficial effect that distortion and the like between the buffering layer and the gallium nitride compound-based semiconductor thin film grown on the buffering layer are alleviated, resulting in a further improved crystallinity.

By incorporating indium into the gallium nitride compound-based semiconductor thin film so that the indium concentration may be decreased in the direction of growth of the thin film from the side on which the thin film is in contact with the buffering layer, the following beneficial effect can be obtained: the difference in lattice constant between the buffering layer and the gallium nitride compound-based semiconductor thin film formed on the buffering layer is reduced near the boundary surface between them, so that the occurrence of distortion, crystal defects, etc. is reduced, resulting in a further improved crystallinity.

By incorporating indium into the gallium nitride compound-based semiconductor thin film by transferring thereto indium in the buffering layer, the following beneficial effect can be obtained: since the concentration of indium contained in the gallium nitride compound-based semiconductor thin film is increased near the boundary surface between the thin film and the buffering layer, the difference in lattice constant between the buffering layer and the thin film is further reduced, so that the occurrence of distortion, crystal defects, etc. is further reduced, resulting in a further improved crystallinity.

By incorporating indium into the gallium nitride compound-based semiconductor thin film by controlling the flow rate of a starting gas containing indium, during the growth of the gallium nitride compound-based semiconductor thin film, the following beneficial effect can be obtained: the concentration of indium contained in the gallium nitride compound-based semiconductor thin film is increased near the boundary surface between the thin film and the buffering layer with good controllability, so that the crystallinity can easily be improved.

In addition, according to the present invention, by using a buffering layer of mixed crystals of AlN and InN, the following beneficial effect can be obtained: distortion due to the difference in lattice constant between the buffering layer and a gallium nitride compound-based semiconductor thin film formed on the buffering layer becomes easily absorbable, so that the gallium nitride compound-based semiconductor thin film possesses markedly improved surface flatness and crystallinity as compared with that obtained by using a conventional buffering layer of AlN.

Furthermore, according to the present invention, the following beneficial effect can be obtained: the surface flatness and the crystallinity are markedly improved, and even when there is formed a gallium nitride compound-based semiconductor thin film for a quantum well structure which is supposed to require flatness at atomic level, a satisfactory hetero-junction boundary surface can be obtained and hence the nonuniformity of the quantum well structure is slight, so that a light emitting device having excellent light-emitting properties can be obtained.

Accordingly, there can be obtained such a beneficial effect that characteristics of light emitting devices and electron devices (e.g. light emitting diodes and semiconductor lasers) which use gallium nitride compound-based semiconductor thin films can be improved.

What is claimed is:

1. A light emitting device comprising:
   a substrate,
   an indium-containing buffering layer disposed on the substrate, and
   a film of gallium nitride compound-based semiconductor disposed on the buffering layer,
   the film containing indium at a surface with which the film is in contact with the buffering layer, and the film having an indium concentration profile which decreases with distance from the surface which is in contact with the buffering layer.

2. A light emitting device comprising:
   a substrate,
   a buffering layer comprising $Al_{1-x}In_xN$, in which $0<x<1$, disposed on the substrate, and
   a film of gallium nitride compound-based semiconductor disposed on the buffering layer, the buffering layer having a smaller solid phase molar ratio value x of In in $Al_{1-x}In_xN$ at a first surface in contact with the film than at a second surface in contact with the substrate.

3. The device of claim 2, wherein the film of gallium nitride compound-based semiconductor contains indium at a surface on which the film is in contact with the buffering layer.

4. The device of claim 2, wherein the buffering layer has a solid phase molar ratio value x of In in $Al_{1-x}In_xN$ satisfying the inequality $0.2 \leq x \leq 0.8$.

5. The device of claim 2, wherein the buffering layer has a solid phase molar ratio value x of In in $Al_{1-x}In_xN$ satisfying the inequality $0.6 \leq x \leq 0.8$.

6. The device of claim 2, wherein the buffering layer has a thickness falling within the range of from 5 nm to 50 nm.

7. The device of claim 2, wherein the film of gallium nitride compound-based semiconductor comprises a film of gallium nitride compound-based, n-type semiconductor and a film of gallium nitride compound-based, p-type semiconductor.

* * * * *